(12) United States Patent
Cujia Pena et al.

(10) Patent No.: US 10,333,276 B2
(45) Date of Patent: Jun. 25, 2019

(54) VERTICAL MICROCAVITY WITH CONFINEMENT REGION HAVING SUB-WAVELENGTH STRUCTURES TO CREATE AN EFFECTIVE REFRACTIVE INDEX VARIATION

(71) Applicant: International Business Machines Corporation, Armonk, NY (US)

(72) Inventors: Kristian Samuel Cujia Pena, Rueschlikon (CH); Thilo Hermann Stoeferle, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/878,346

(22) Filed: Oct. 8, 2015

(65) Prior Publication Data

US 2017/0104313 A1 Apr. 13, 2017

(51) Int. Cl.
| | |
|---|---|
| *G02B 5/18* | (2006.01) |
| *G02B 5/28* | (2006.01) |
| *H01S 5/10* | (2006.01) |
| *H01S 5/42* | (2006.01) |
| *H01S 5/183* | (2006.01) |
| *H01S 5/20* | (2006.01) |

(52) U.S. Cl.
CPC ........ *H01S 5/1042* (2013.01); *H01S 5/18319* (2013.01); *H01S 5/18361* (2013.01); *H01S 5/423* (2013.01); *G02B 5/1809* (2013.01); *G02B 5/288* (2013.01); *H01S 5/2027* (2013.01); *H01S 5/2086* (2013.01)

(58) Field of Classification Search
CPC ..... H01S 5/2027; H01S 5/2086; H01S 5/1042
See application file for complete search history.

(56) References Cited

U.S. PATENT DOCUMENTS

| | | | |
|---|---|---|---|
| 5,245,622 A | 9/1993 | Jewell et al. | |
| 5,253,262 A * | 10/1993 | Kurobe | B82Y 20/00 |
| | | | 372/45.01 |
| 5,726,805 A | 3/1998 | Kaushik et al. | |
| 6,711,200 B1 | 3/2004 | Scherer et al. | |
| 7,304,781 B2 | 12/2007 | Chang-Hasnain et al. | |
| 7,693,203 B2 | 4/2010 | Birkedal et al. | |
| 7,729,043 B2 | 6/2010 | El Daif et al. | |
| 8,059,690 B2 | 11/2011 | Chang-Hasnain et al. | |
| 2012/0194911 A1 * | 8/2012 | Li | G02B 5/1809 |
| | | | 359/566 |

(Continued)

*Primary Examiner* — Xinning (Tom) Niu
*Assistant Examiner* — Sean P Hagan
(74) *Attorney, Agent, or Firm* — Harrington & Smith

(57) ABSTRACT

Embodiments are notably directed to a vertical microcavity. The vertical microcavity includes a first reflector and a second reflector, each of which includes one or more material layers extending perpendicular to a vertical axis x. The cavity may further include a confinement region extending between the first reflector and the second reflector, so as to be able to confine an electromagnetic wave. The confinement region may include a single layer material, which is structured so as to create an effective refractive index variation for the electromagnetic wave to be confined, in an average plane of the single layer material, perpendicularly to said vertical axis x. Additional examples are further directed to related microcavity systems and methods of fabrication.

22 Claims, 4 Drawing Sheets

(56) References Cited

U.S. PATENT DOCUMENTS

2012/0314292 A1* 12/2012 Mathai .................. G02B 5/1819
359/575
2013/0258454 A1 10/2013 Ding et al.

* cited by examiner

VERTICAL MICROCAVITY WITH CONFINEMENT REGION HAVING SUB-WAVELENGTH STRUCTURES TO CREATE AN EFFECTIVE REFRACTIVE INDEX VARIATION

FIELD

The invention relates in general to the field of vertical microcavities. In particular, it is directed in an exemplary embodiment to a vertical microcavity comprising a confinement layer configured to provide an effective refractive index variation in-plane, as well as exemplary methods of fabrication of such a vertical microcavity.

BACKGROUND

Optical microcavities are known to confine light to a small volume. Devices using optical microcavities are today essential in many fields, ranging from optoelectronics to quantum information. That is, they are key components for lasers, optical filters, optical sensors and devices for optical quantum computing and simulations. Typical applications are long-distance data transmission over optical fibers and read/write laser beams in DVD/CD players. A variety of confining semiconductor microstructures has been developed and studied, involving various geometrical and resonant properties. A micro cavity has smaller dimensions than a conventional optical cavity; it is often only a few micrometers thick and the spacer layer that it comprises can even reach the nanometer range. Such dimensions notably allow for studying quantum effects of electromagnetic fields.

In more detail, a cavity or a microcavity forms an optical cavity or resonator, which allows for a standing wave to form inside the spacer layer. The light emission is perpendicular to the substrate plane. The thickness of the spacer layer determines the cavity-mode, which corresponds to the wavelength that can be transmitted and forms a standing wave inside the resonator. An ideal cavity would confine light indefinitely (that is, without loss) and would have resonant frequencies at defined values. The deviations from this ideal paradigm are captured by the cavity Q factor, which is proportional to the confinement time in units of the optical period. However, some losses are actually required, because otherwise, e.g., no laser light could be outcoupled or no light could be filtered. Now, other parasitic loss channels than the intended one should be limited as much as possible. For instance, one may deliberately choose a mirror reflectivity below 100%, e.g., only 99%, to make sure that light leaves the cavity only in a certain direction, through this mirror and not through scattering losses (in all directions).

Another important descriptive parameter is the effective mode volume (V), which relates to the optical modes present in the cavity. Every mode has a certain mode volume, i.e., the spatial volume which will be filled with photons when a mode is excited. So the mode volume is a property of each and every mode (and will differ between the modes). Vertical cavities (including cavities as contemplated in the detailed description below) preferably support only a single mode or a few modes that would all have a small effective mode V. Such a configuration is indeed desirable for most applications.

Accordingly, the realization of practical devices requires maximizing the ratio Q/V, i.e., high values for Q and low values for V are important to increase light-matter interactions in processes such as spontaneous emission, lasing, nonlinear optical processes and strong coupling.

More in details, the quality factor or Q factor is a dimensionless parameter that describes how under-damped an oscillator or resonator is. The value of Q is usually defined as $2\pi \times$the total energy stored in the structure, divided by the energy lost in a single oscillation cycle. A high quality factor Q and a small mode volume V are desirable for many applications but are hard to reach simultaneously.

Vertical microcavity designs have been proposed, wherein a light confinement region is defined between reflectors, where the confinement region comprises a "defect", e.g., (i) a disk-shaped structure (e.g., forming an aperture), formed from an absorbing material or a metal; (ii) a mesa (e.g., of a dielectric/semiconductor material); or (iii) a 3D-shaped defect (e.g., formed from a dielectric material). The first two designs, however, provide low Q factors, typically less than $10^4$, whereas 3D-shaped defects requires 3D lithography.

SUMMARY

This section is meant to describe one or more exemplary embodiments and is not meant to be limiting.

According to a one aspect, the present invention may be embodied as a vertical microcavity. The latter comprises in an exemplary embodiment: a first reflector and a second reflector, each comprising one or more material layers extending perpendicular to a vertical axis x. The cavity may further comprise a confinement region extending between the first reflector and the second reflector, so as to be able to confine an electromagnetic wave. The confinement region may comprise a single layer material, which is structured so as to create an effective refractive index variation for the electromagnetic wave to be confined, in an average plane of the single layer material, perpendicularly to said vertical axis x.

BRIEF DESCRIPTION OF SEVERAL VIEWS OF THE DRAWINGS

FIGS. 3 and 4 depict, each, a microcavity system wherein the confinement region comprises several sets of lithographic structures, forming an array of microcavities, according to embodiments. The upper reflector layer structure is off-centered to ease the view, in each case.

Similar or functionally similar elements in the figures have been allocated the same numeral references, unless otherwise indicated. Technical features depicted in the drawings are not necessarily to scale.

DETAILED DESCRIPTION OF EMBODIMENTS OF THE INVENTION

Figure 1:
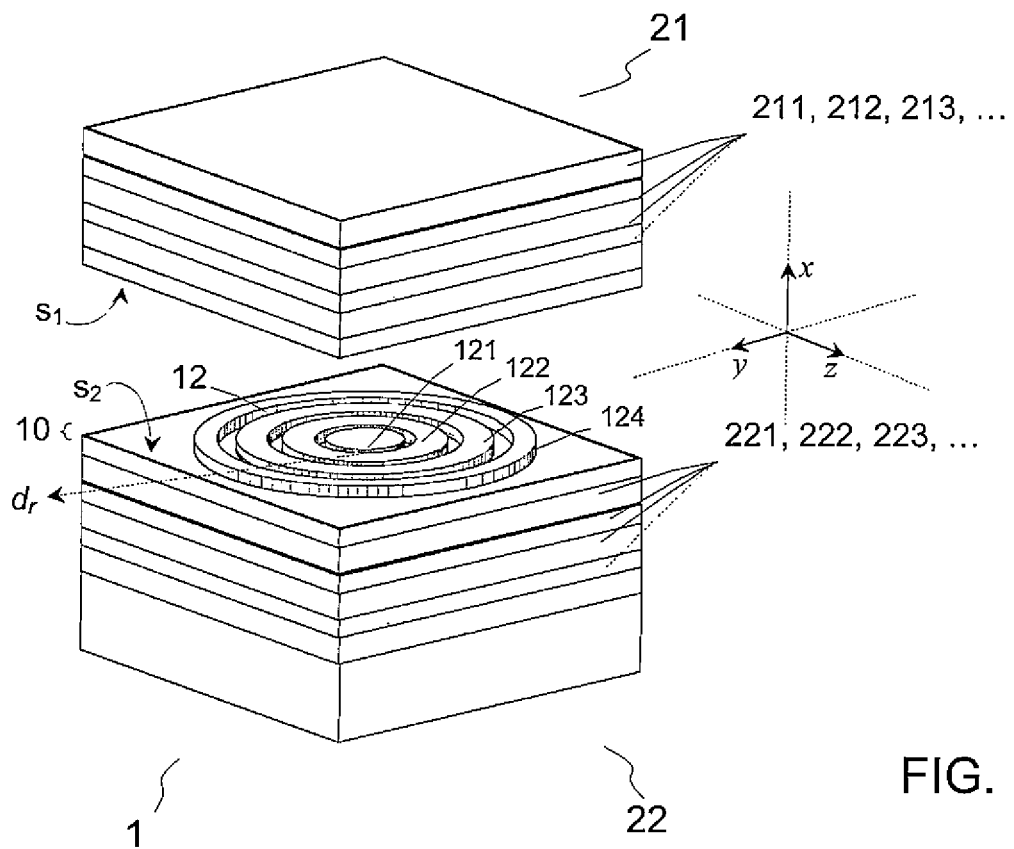
FIGS. 1-4 depict, each, a 3D view of a simplified representation of a vertical microcavity (or a system of cavities), according to embodiments.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As stated above, according to one aspect, the present invention may be embodied as a vertical microcavity. The latter comprises in an exemplary embodiment: a first reflector and a second reflector, each comprising one or more material layers extending perpendicular to a vertical axis x. The cavity may further comprise a confinement region extending between the first reflector and the second reflector, so as to be able to confine an electromagnetic wave. The confinement region may comprise a single layer material, which is structured so as to create an effective refractive index variation for the electromagnetic wave to be confined, in an average plane of the single layer material, perpendicularly to said vertical axis x.

Such an example allows re-creation of an effective variation of the refractive index via a single layer, structured material, where the single layer material can be structured via e.g., any standard 2D lithographic method.

In particular, the single layer material may be most simply structured so as to exhibit partly or fully distinct lithographic structures, e.g., having each a same height H. Meanwhile, the in-plane dimensions of and/or pitch between the lithographic structures can be spatially modulated (in-plane) to obtain the desired effective index variation.

The confinement region may accordingly exhibit repeating sequences of at least two (or more preferably only two) distinct refractive indices n1, n2, along a given direction in the average plane of the single layer material.

The above principles can be relied upon to devise a microcavity system (also according to embodiments), comprising the same features as the above vertical microcavity, but wherein the confinement region comprises several sets of lithographic structures. Each of these sets may comprise concentric, distinct structures and defines repeating sequences of distinct refractive indices along a radial direction extending from a center of said each of the sets of lithographic structures, in the average plane of the single layer material. The sets of lithographic structures form in that case an array of microcavities (rather than a single microcavity), together with the reflectors, which can advantageously be used for, e.g., multi-channel laser arrays or similar devices (e.g., where vertical-cavity surface-emitting lasers, or VCSELs, couple into fiber arrays).

According to another aspect, the invention can be embodied as a method for fabricating a vertical microcavity as described above. This method basically revolves around a step of depositing a single layer material and structuring it so as to obtain a suitably structured single layer material. In preferred embodiments, the deposited single layer material is structured using a 2D lithographic method (and more preferably a standard 2D lithographic method).

Now that an introduction has been provided, more detail is provided. In reference to FIGS. 1-7, an aspect of the invention is first described, which concerns a vertical microcavity 1, 1a.

Figure 2:
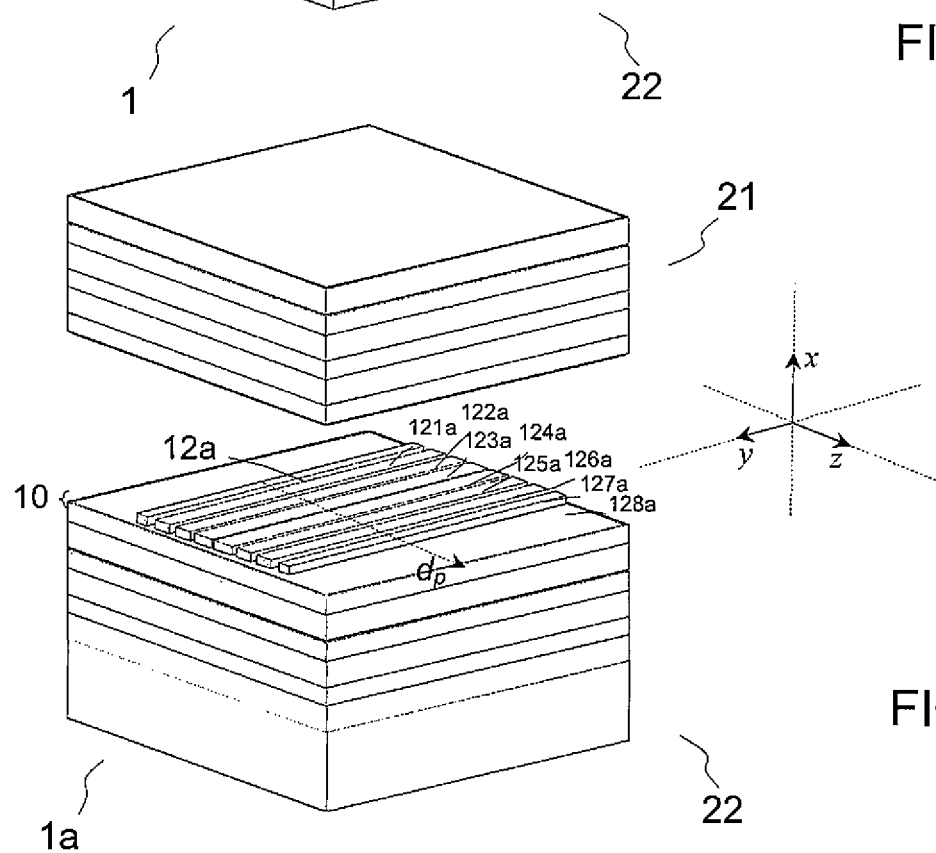

Such a material layer basically comprises in an exemplary embodiment: a first reflector 21 and a second reflector 22. Each of the reflectors comprises one or more material layers (as denoted by numeral references 211, 212, 213, ... and 221, 222, 223, ... in FIG. 1). The average plane of these material layers extends perpendicular to a vertical axis x, as depicted in FIGS. 1 and 2.

The vertical material layers further comprise a confinement region 10. This region generally extends between the first reflector 21 and the second reflector 22. Such reflectors are devices that, each, cause reflection. Present reflectors notably include examples such as Bragg reflectors, in particular distributed Bragg reflectors DBRs, grating mirrors, in particular, high contrast grating mirrors, or, still, metal reflectors. Mirrors that can be used in embodiments of this invention may for instance consist of single lithographically structured layers, as disclosed in U.S. Pat. No. 7,304,781 or U.S. Pat. No. 8,059,690.

As known per se, this confinement region 10 is configured to confine an electromagnetic wave. Here, the confinement region 10 comprises a single layer material. The single layer material is denoted by numeral reference 12 in FIG. 1, reference 12a in FIG. 2 and reference 12d in FIG. 7. This single layer material is furthermore structured so as to create an effective refractive index variation (as experienced by the electromagnetic wave to be confined in the cavity), in an average plane P of the single layer material 12, i.e., perpendicularly to the vertical axis x. The average plane P is parallel to the plane (y, z) in FIGS. 1 and 2. Superimposed single layer materials may be used, in place of a unique layer 12, 12a, 12d.

To obtain the desired, effective refractive index variation, the single layer material 12, 12a, 12d may notably be structured, in-plane, to give rise to partly or fully distinct structures. Examples of such lithographic structures are shown in FIG. 1 (denoted by references 121-124), FIG. 2 (refs. 121a-128a), FIG. 5 (refs. $12_{i,j}$) and in FIGS. 6, 7 (2D cross-section, refs. 121d-126d). The in-plane arrangement and/or dimensions of such structures may, in turn, be spatially modulated to emulate the desired refractive index variation.

In particular, the in-plane separating distance (or pitch) and/or the dimensions of these structures may be designed to be less than $\lambda/(2n)$ (or even less than $\lambda/(4n)$, in applications), where n is the refractive index of the single layer material, and $\lambda$ is the vacuum wavelength of the light to be confined. This makes it possible to obtain the desired effective refractive index, rather than photonic bandgaps or the likes, which are caused by constructive/destructive interference from the reflective/refractive structures. In the latter case, the lithographic structures can be referred to as "sub-wavelength" structures, i.e., structures that have sub-wavelength dimensions and/or a sub-wavelength pitch in the plane (y, z), with respect to the typical (or average) wavelength of light to be confined.

The present designs of the confinement region 10 allow re-creation of a variation of the refractive index effectively experienced by the confined wave, via a suitably structured single layer material (or superimposed sequence thereof). Advantageously, said (e.g., sequence of) single layer material can be structured using a 2D lithographic method, in particular using any standard 2D lithographic method. The exemplary present designs of microcavity are accordingly very simple to fabricate, as opposed to prior art designs known to the Inventors. Meanwhile, the above design allows, in embodiments, satisfactory Q factor values to be achieved.

As briefly described above, the confinement region may comprise a sequence of material layers superimposed in the x-direction, e.g., in the manner of a multi-quantum well hetero structure for optical gain, in place of a unique single layer material. In such cases, at least part of this sequence may be structured so as to create the desired effective refractive index variation. Thus, the confinement region may, in most general embodiments, comprise one or more suitably structured single layer materials. Where more than one single layer materials are used, these are superimposed to form a vertical sequence of layers. This sequence is structured to form partly or fully distinct lithographic structures, which structures are arranged in a plane (y, z) perpendicular to the vertical axis x. As a result, the structured sequence of single layer materials gives to an effective refractive index variation in the average plane of the sequence (i.e., perpendicularly to said vertical axis x). Again, such a sequence can be structured using any (standard) suitable 2D lithography method.

In addition, additional functional layers may be involved in the confinement region. For instance, additional functional layers may be added below or above the structured layer 12, 12a, 12d (or sequence of superimposed layers). Such functional layer may for instance include a gain or a nonlinear material.

For simplicity, a single layer material 12, 12a, 12d is assumed hereafter, without loss of generality.

This single layer material 12, 12a, 12d may, in embodiments, be structured so as to exhibit distinct (i.e., neatly separated) lithographic structures, as illustrated in FIGS. 1-7. As it may be realized, using distinct lithographic structures makes it easier to control the effective refractive index variation. Now, depending on the lithographic method use to structure the layer 12, 12a, 12d, a residual layer may subsist, such that the lithographic structures may not be fully distinct.

The single-layer material 12, 12a, 12d is preferably obtained by depositing a material layer having a constant thickness (to further ease the fabrication process). Lithographic structures subsequently obtained by structuring this material layer will accordingly have a same (maximal) height H, as for instance illustrated in FIGS. 6, 7.

Figure 7:
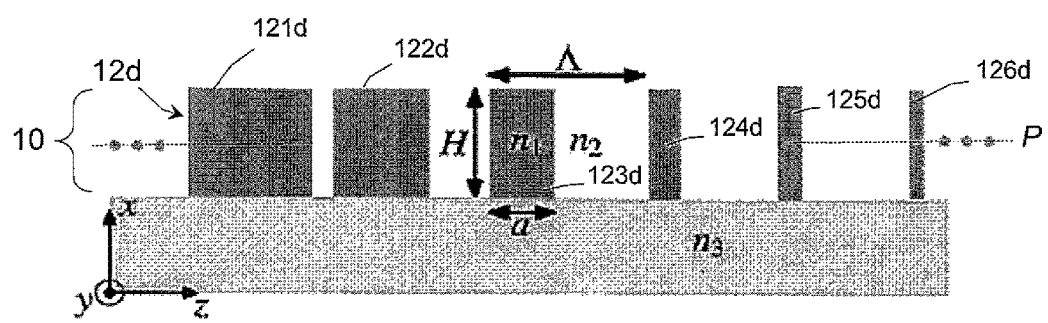
FIG. 7 is a 2D cross-sectional view of a simplified representation of a structured single layer material corresponding to FIG. 6, according to embodiments.

Referring more particularly to FIG. 7, the lithographic structures 121d-126d may, in embodiments, be configured so as for the confinement region 10 to exhibit repeating sequences of two distinct refractive indices $n_1$, $n_2$, along a given direction in the average plane P of the single layer material 12d. Namely, light successively "sees" media exhibiting refractive indices $n_1$, $n_2$, $n_1$, $n_2$, $n_1$, $n_2$, etc., along direction z in the confinement region, thereby forming repeating sequences of two distinct values of refractive indices.

In FIG. 7, $n_1$ denotes the refractive index value of the structure, corresponding to the refractive index value of the single layer material 12d. For example, $n_1$=2.1 where $Ta_2O_5$ is used for the material 12d (the refractive index of $Ta_2O_5$ is typically measured to be between 2.0-2.2, dependent on the general conditions, the thin film density, etc.). In variants, $n_1$=1.49 if poly(methyl methacrylate), or PMMA for short, is used in place of $Ta_2O_5$. Any oxide-based dielectric material (possibly doped) can be contemplated. More generally, any dielectric or, even, a semiconductor layer having a typical refractive index value between 1 and 5 may be contemplated.

The refractive index $n_2$ value depends on the complementary material(s) or media used in the confinement (air, vacuum, polymer, dielectrics, etc.) and may be larger or smaller than the value of the refractive index $n_1$, as discussed below. More generally, $n_2$ may correspond to one of the following materials: air, a transparent material, an active material, a nonlinear material or a sensing medium for bio-sensor or environment sensor. That is, the confinement layer may be partially or fully filled with air or a transparent, active or nonlinear material polymer, or semiconductor, etc., or, still, a sensing medium for bio- or environment sensors. An active material is a light emitting material or a material with optical gain, as known per se.

Figure 6:
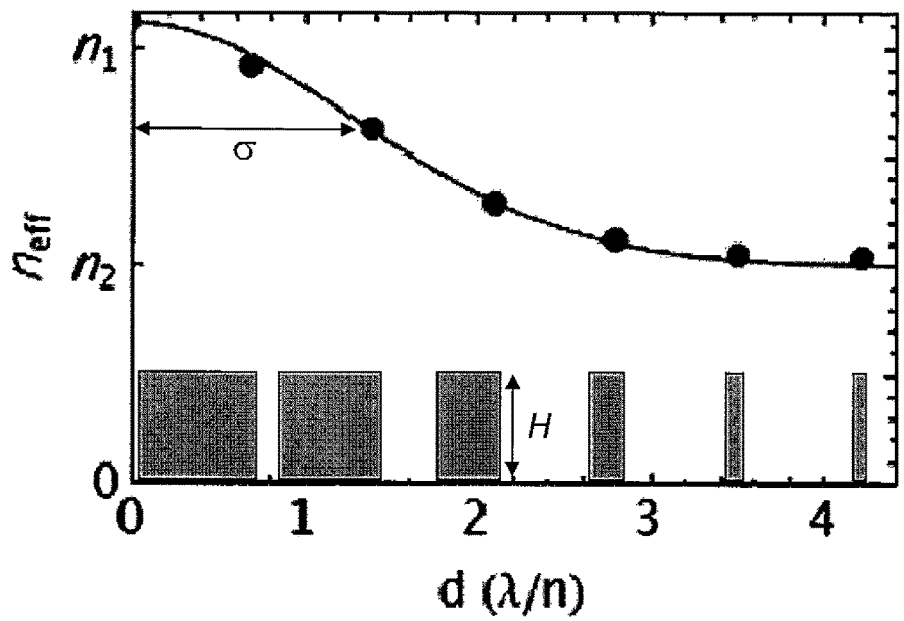
FIG. 6 is a graph representing a variation of an effective refractive index as obtained thanks to a suitably structured single layer material in the confinement region, as involved in embodiments.

As evoked just above, two different refractive indices $n_1$ and $n_2$ are needed. For instance, considering the embodiment of FIG. 1, the concentric rings could be made either of the lower or the higher index material. However, in embodiments, it is preferred to have an "effective index" that is higher at the center of the concentric rings (as depicted in FIG. 6). In such case, $n_1$ is chosen so as to be larger than $n_2$. However, this is, in general, not absolutely necessary as the dimensions and pitch of the lithographic features are used to control the effective index. For instance, one may want, in embodiments, to make use of the electric field enhancement (which occurs, e.g., in a narrow slit of low index material), in which case one would chose $n_1 < n_2$.

Only two distinct refractive indices $n_1$ and $n_2$ were assumed so far. However, in more sophisticated variants, sequences of K complementary materials $n_2, \ldots, n_{K+1}$ may be used so as for the confinement region to exhibit repeating sequences of more than two distinct refractive indices $n_1$, $n_2, \ldots, n_{K+1}$, along a given direction in the average plane P (not shown). Such variants will, however, be more difficult to fabricate.

As further illustrated in FIGS. 6, 7, an effective refractive index gradient may be obtained by spatially varying a dimension of, and/or pitch (i.e., the first-neighbor distance) between, the structures 121d-126d. As the size of lithographic structures is typically in the same order of magnitude as the gap, the pitch should be distinguished from the inter-structure gap. For instance, in FIG. 7, the pitch refers to the distance between the "left edges" of two neighboring structures, i.e., the pitch corresponds to the sum of the gap and the width of a structure.

Assume, for example, that the lithographic structures 121d-126d comprise N distinct structures $S_1, S_2, \ldots, S_N$, each having a respective width $a_i$ (i.e., in a direction parallel to the plane 1). Any two consecutive lithographic structures $S_i, S_{i+1}$ are separated by a distance $\Lambda_{i,i+1}$ along the considered direction ($\Lambda_{i,i+1}=a_i+g_{i,i+1}$, where g denotes the gap between features i and i+1). In order to obtain an effective refractive index variation, the lithographic structures may notably be designed so as for the ratio $r_i=a_i/\Lambda_{i,i+1}$ to be a non-constant function of i, i=1, ..., N−1. As a result, the ratio $r_i$ varies along the considered direction (in the average plane P).

In particular, a spatially varying ratio $r_i$ may be obtained if one, or each of the width $a_i$ and the separating distance $\Lambda_{i,i+1}$ is a non-constant function of i, i=1, ..., N−1. In the example of FIGS. 6 and 7, each of the width $a_i$ and the separating distance $\Lambda_{i,i+1}$ are varied. Note that, for conciseness, only the width a of the structure 123d and the distance $\Lambda$ separating the structures 123d and 124d are explicitly identified in FIG. 7. By varying both the width $a_i$ and the separating distance $\Lambda_{i,i+1}$, the resulting effective index gradients may be made steeper in practice, i.e., so that the resulting cavity confinement can be made higher. However, depending on the lithographic methods used, it may be preferred to keep one of the two parameters ($a_i$ or $\Lambda_{i,i+1}$) constant and only vary the other parameter.

As furthermore assumed in the embodiments of FIGS. 6, 7, the ratio $r_i = a_i/\Lambda_{i,i+1}$ may be a monotonically decreasing function of i, i=1, ..., N−1. This way, a precise control of the refractive index variation may be obtained. For instance, the arrangements depicted in FIGS. 6 and 7 allow the effective refractive index to decrease (e.g., smoothly) from value $n_1$ to value $n_2$. The quantity σ represented in FIG. 6 denotes the half-width radius of decay between $n_1$ and $n_2$.

As evoked earlier, the lithographic structures are advantageously dimensioned as sub-wavelength structures, for the applications typically contemplated herein. A sufficient condition to achieve suitable sub-wavelength structures is the following. Assume that the microcavity is configured so as to be able to confine an electromagnetic wave of a given vacuum wavelength λ. In that case, the pitch $\Lambda_{i,i+1}$ is designed to be less than $\lambda/2n_1$, where $n_1$ is the refractive index of the structured single layer material (e.g., 12d in FIG. 7), and this, for all i=1, ..., N−1, along a direction of interest in the plane P. Even smaller values of the pitch $\Lambda_{i,i+1}$ can be contemplated, e.g., $\Lambda_{i,i+1} < \lambda/bn_1$, with b>2 (e.g., b>3 and not necessarily integer). This may provide lower scattering loss, at the expense of a more difficult fabrication.

In embodiments, one may for instance require that each of $a_i$ and $g_{i,i+1}$ be less than $\lambda/4n_1$, to make sure that the pitch $\Lambda_{i,i+1}$ be less than $\lambda/2n_1$.

Figures 3, 4:
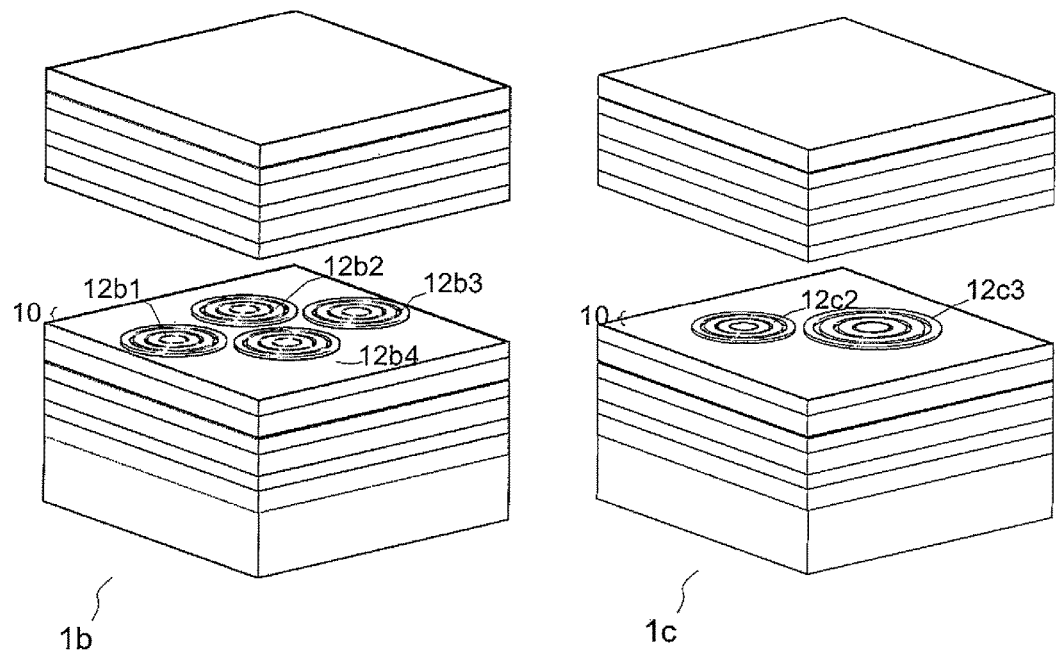

The lithographic structures may otherwise have different shapes. As illustrated in FIGS. 1, 3 and 4 (and more particularly in FIG. 1), the lithographic structures may, in embodiments, comprise N concentric structures 121-124. In that case, the confinement region 10 exhibits repeating sequences of distinct refractive indices $n_1$, $n_2$ along the radial direction $d_r$ extending from the center of the concentric structures (in the average plane of the single layer material 12 in FIG. 1, i.e., parallel to (y, z)). Note that FIGS. 6, 7 may be regarded as a cross-section of a confinement region exhibiting spatially varying concentric structures 121d-126d, where, e.g., the widest structure 121d would correspond to an innermost disk-shaped structure and structure 126d would correspond to an outermost ring-shaped structure. The concentric structures need not necessarily be disk/ring-shaped but may form other geometrical structures, e.g., subtended by (convex) polygons.

In variants such as illustrated in FIG. 2, the lithographic structures may comprise N parallel, distinct structures 121a-128a, that are spatially varying. In that case, the confinement region 10 exhibits repeating sequences of materials having distinct refractive indices $n_1$, $n_2$ along direction $d_p$ extending perpendicularly to the parallel structures 121a-128a in the average plane of the structured single layer material 12a. In this respect, FIGS. 6, 7 may alternatively be regarded as a cross-section of a confinement region exhibiting spatially varying parallel structures 121d-126d, where the direction z extends perpendicularly to the parallel structures.

In other words, the variant of FIG. 2, light is confined in the vertical direction x by the reflectors, whereas only one lateral dimension is confinement, in-plane, thanks to the effective refractive index gradient, produced by the modulated sub-wavelength structures. The other lateral dimension is not confined As a result, the (far field) pattern emitted from the cavity towards the top or the bottom (along direction x) will be a line ("fan"-like emission), instead of being spot-like (e.g., TEM00-like, cone-like emission) when the confinement is in both lateral dimensions.

More generally, one understands that FIGS. 6, 7 may be regarded as cross-sections of spatially varying structures, concentric or not, i.e., where the direction z of interest extends perpendicularly to the structures and is a radial direction (as in FIG. 1) or a perpendicular direction (as in FIG. 2).

Figure 5:
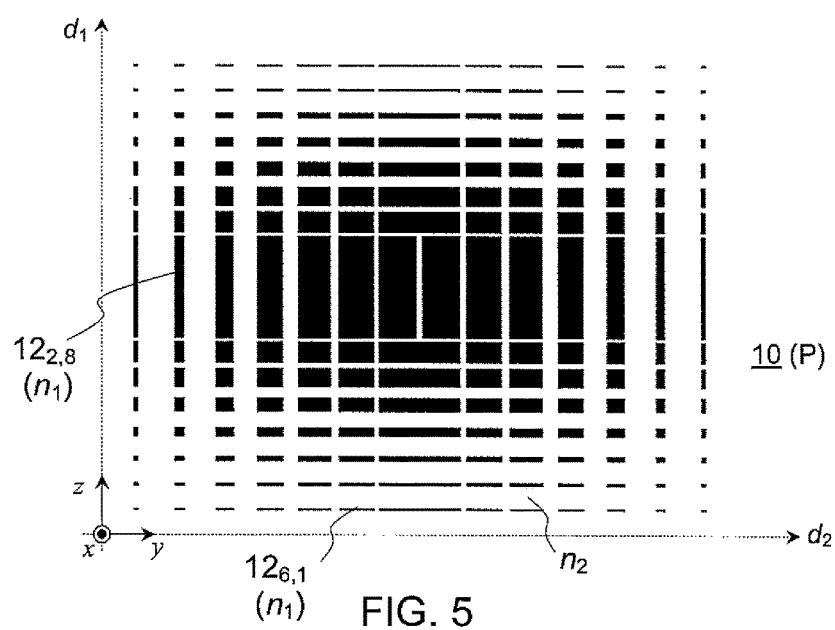
FIG. 5 is a top view of a simplified representation of a confinement region of a cavity, wherein the lithographic structures form a non-periodic, finite 2D lattice, as involved in embodiments.

More complex arrangements of lithographic structures may nevertheless be contemplated. For example, and as illustrated in FIG. 5, the lithographic structures $12_{i,j}$ may, in embodiments, form a non-periodic, finite 2D lattice of lithographic structures. In such a case, the confinement region 10 exhibits repeating sequences of distinct refractive indices $n_1$, $n_2$ along each of the two directions $d_1$, $d_2$ which extend perpendicularly to each other in the average plane P of the single layer material. Directions $d_1$, $d_2$ may for instance correspond to directions y and z in FIGS. 1, 2. In fact, in FIG. 5, the structures form a non-constant lattice of sequences of indices $n_1$, $n_2$.

In FIG. 5, structures with modulated in-plane dimensions and pitch are used. In variants, only the size may be varied, in a periodic lattice geometry. The in-plane sectional shape of the elements is unimportant as long as it remain of sub-wavelength dimension.

Note that in each of FIGS. 1, 2, 5-7, the lithographic structures are designed and arranged so as to give rise to a bell-shaped (e.g., Gaussian) index variation. Depending on the application sought, however, other index variation profiles may be contemplated, e.g., Lorentzian, hemi-spherical, parabolic.

Different sets of lithographic structures may be provided, to form an array of vertical microcavities. In that respect, and referring now more particularly to FIGS. 3 and 4, the present invention may be embodied as a microcavity system 1b, 1c. Each of the microcavity system 1b, 1c may comprise the same features as the vertical microcavities described so far, i.e., a first reflector, a second reflector and a confinement region with a single layer material (or superimposed sequence of material), structured so as to create an effective refractive index variation within the confinement region. However, in the microcavity systems 1b, 1c, the confinement region 10 now comprises several sets 12b1-12b4, 12c1-12c2 of lithographic structures.

Each set may for instance comprise concentric structures, as described earlier in reference to FIG. 1. The sets 12b1-12b4, 12c1-12c2 depicted in FIGS. 3, 4 form, together with the reflectors and the second reflector, an array of vertical microcavities. The microcavity systems of FIGS. 3 and 4 may advantageously be used for multi-channel laser arrays or similar devices, e.g., where VCSELs couple into fiber arrays.

In FIG. 3, the centers of the sets 12b1-12b4 of concentric lithographic structures are arranged according to a periodic 2D lattice in the average plane of the single layer material. Microcavity systems such as depicted in FIG. 3 may advantageously be used for laser arrays, pixel filter arrays, coupled-resonator filters, or, still, photonic quantum simulators. In variants, the centers of the concentric sets may be arranged according to a periodic 1D lattice, e.g., for linear laser arrays.

In FIG. 4, two sets 12c1, 12c2 of concentric lithographic structures are provided, wherein said sets have distinct geometrical features, so as to exhibit distinct resonance frequencies, to enable Vernier tuning. Combinations of the geometries of FIGS. 3 and 4 can be contemplated.

Preferably, the average plane P of the single layer material evoked earlier in reference to FIG. 1, 2 or 7 corresponds to a midplane of the confinement region. That is, as seen in FIG. 1, the distance between the average plane P and the inner surface $s_1$ of the first reflector 21 is, in that case, substantially equal to the distance between the average plane P and the an inner surface $s_2$ of the second reflector 22, the confinement region 10 being defined between the two inner surfaces $s_1$ and $s_2$. Such a configuration leads to a "slot effect enhancement", i.e., the mode volume is typically reduced by more than one order of magnitude. Meanwhile, a stronger lateral confinement is obtained due to the higher effective index contrast in that case.

In variants, the sub-wavelength structures may be off-centered toward one of the two inner surfaces $s_1$ and $s_2$, e.g., directly thereon, while an additional layer of material may be provided on the opposite surface. Off-centering the lithographic structures is sometimes more practical due to restrictions on the layer sequences, thicknesses or lithography. However, such a configuration reduces (or suppress) the slot effect-enhancement for the active material. In addition, a weaker lateral confinement is obtained, due to a reduced effective index contrast as sub-wavelength structures are not placed in the field maximum in that case.

In embodiments, the reflectors may be DBR mirrors, i.e., structures which are formed from multiple layers of alternating materials (layer pairs) with varying refractive index. Each layer boundary causes a partial reflection of an optical wave. For example, the top and bottom DBR mirrors may comprise, each, pairs of $Ta_2O_5$ (with thickness $\lambda/(4n_4)$, where $n_4=2.1$ for $Ta_2O_5$) and $n_3=1.46$ for $SiO_2$ (with thickness $\lambda/(4n_3)$). Assuming 15 layer pairs of $Ta_2O_5$ and $SiO_2$ would already yield a reflectivity of about 99.99%. Such a high reflectivity likely ensures that transmission losses through the mirrors are much lower than losses induced by scattering from the cavity, a thing that, in turn, allows to optimize for the lowest scattering loss (e.g., with numerical simulations).

A high reflectivity of the DBR is desirable for the numerical optimization of the sub-wavelength structures for the highest Q factor, i.e., the lowest parasitic losses. Yet, for many applications such as lasers, filters, etc., the reflectivity of the actually fabricated mirrors will typically be lower, e.g., such that their transmission losses are equal the scattering losses (i.e., so-called "critical coupling") or higher (e.g., in order to achieve the desired out-coupling efficiency for a laser).

In variants, also semiconductors may be used for all or just some of the layers, instead of dielectrics.

Some more quantitative considerations follow. In FIG. 7, assumptions made are that $\Lambda_{i,i+1} \ll \lambda/2n_1$ ∀ i, to emulate an effective medium for incident light of vacuum wavelength $\lambda$.

The effective refractive index variation is obtained by spatially modulating characteristics of the sub-wavelength structures. In particular, and as discussed earlier, this can be achieved by locally varying the ratio $r_i$.

Assume that the following dimensions apply:

$\lambda$~480 nm;

$n_1=2.1$, $n_2=1.0$, $n_3=1.46$ and $n_4=2.1$. Note that in FIG. 7, the sub-wavelength structures are arranged on a $SiO_2$ spacer layer (of index $n_3=1.46$), in order to have the sub-wavelength structures "on-center"), which spacer layer is in turn placed on top of a bottom DBR;

The resolution of the lithographic structures are ~$\lambda/48$ to $\lambda/24$, i.e., 10 nm to 20 nm (a larger resolution may still work, although the quality of the confinement then obtained might significantly degrade);

Min[$a_i$] is on the order of the resolution;

$\Lambda_{i,i+1} \ll \lambda/2n_1$, e.g., $\Lambda_{i,i+1}$~$\lambda/10$ to ~$\lambda/5$: 48 nm to 96 nm (larger values being also possible, although not necessary);

Max[$a_i$]~Max[$\Lambda_{i,i+1}$]−Min[$a_i$], and

H>40 nm (for the grating on-center, to ensure enough index contrast for lateral confinement). "On-center" means that the average plane P of the single layer material corresponds to the midplane of the confinement region, as discussed earlier.

Furthermore, each of the DBR mirrors comprise 15 layer pairs that consist of one layer with thickness $\lambda/4n_3$ of material with refractive index $n_3$ and one layer with thickness $\lambda/4n_4$ of material with refractive index $n_4$. For higher index contrasts ($n_1$/Max($n_2,n_3$)), parameters may change.

Assuming the above (e.g., realistic) values, numerical simulations on spatially modulated, concentric structures (such as depicted in FIG. 1, have shown that the resulting Q factor may be in the range Q~$10^4$ to $10^5$, while V~$0.01(\lambda/n)^3$ to ~$2.00(\lambda/n)^3$, the exact values of Q and V depending on the exact configuration simulated. To achieve structures at the lower bound (V~0.01), the grating is on-center, so as for the mode volume to become significantly smaller than the wavelength, due to the "slot effect". For the upper bound (V~2.00), an arbitrary placement of the confinement layer between the mirrors can be used. Thus, at least some of the embodiments of the present microcavities allow satisfactory high values for Q and low values for V to be obtained.

Stronger interaction occurs with the grating on-center. This leads to smaller V but also to smaller Q (so that Q/V remains approximately constant).

Finally, and according to another aspect, the invention can be embodied as a method of fabrication of a vertical microcavity (or a microcavity system) as described above. In an exemplary embodiment, and thanks to the microcavity designs proposed herein, such a method revolves around depositing S30 (FIG. 8) a single layer material (or a sequence of superimposed single layer materials) and structuring S40 the single layer material (or sequence) so as to obtain a suitably structured single layer material (or sequence). No complex 3D patterning of, e.g., a continuously varying 3D shape is for instance required. As evoked earlier, structuring the deposited single layer material may be carried out using any suitable 2D lithographic method. Preferably, any standard 2D lithographic method that is able to produce the required dimensions can be used.

Figure 8:
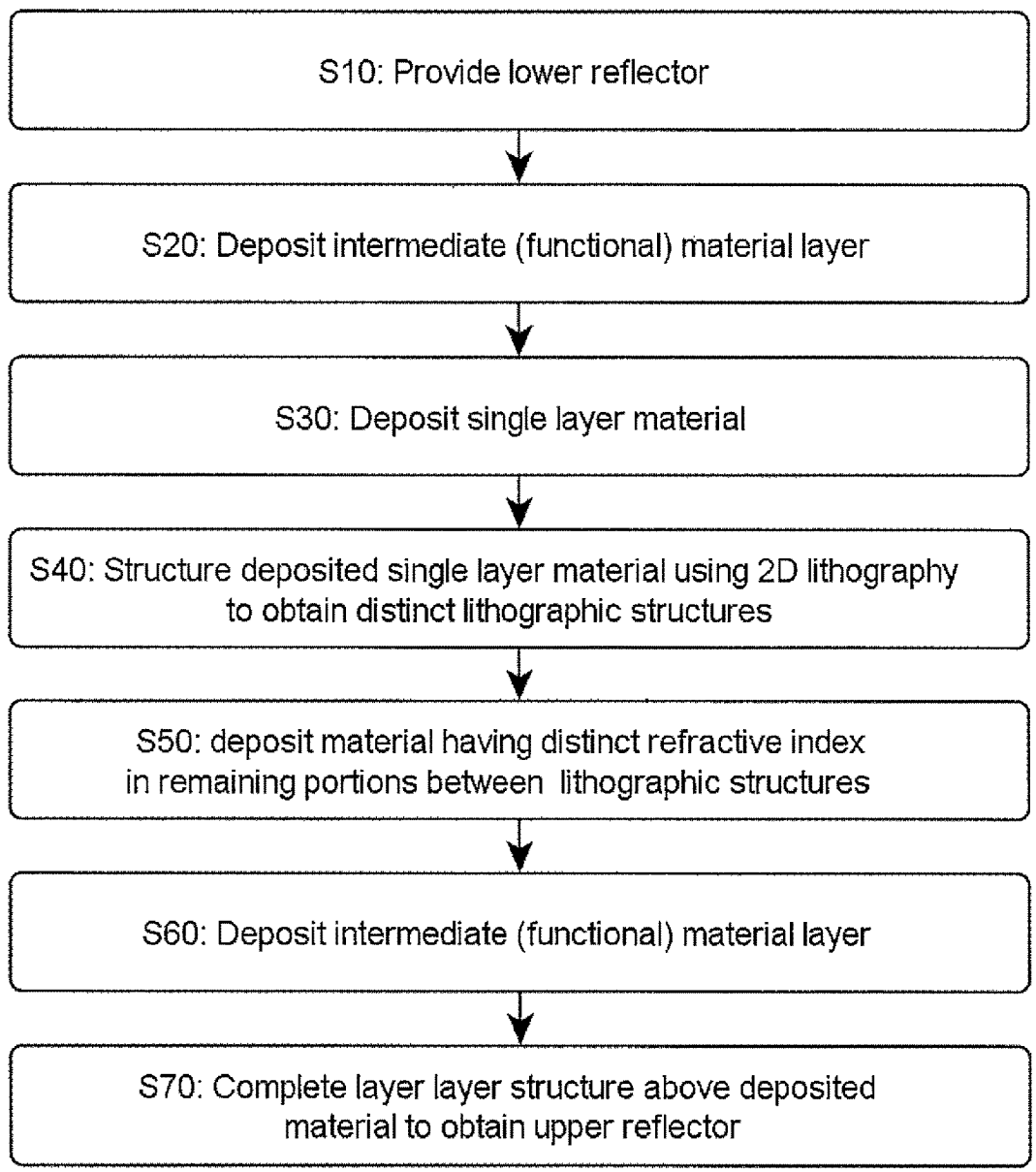
FIG. 8 is a flowchart illustrating high-level steps of a method of fabrication of a vertical microcavity, according to embodiments.

FIG. 8 illustrates high-level steps of a complete fabrication method, according to embodiments, wherein a unique single layer material is assumed. First, a layer structure is fabricated to obtain a lower reflector, S10. Optionally, an intermediate material layer (e.g., of functional material) may be deposited, S20, so as to obtain a lower deposition surface. Next, a single layer material is deposited S30 and then structured S40, to form the sub-wavelength structures. At step S50, a material having a distinct refractive index is deposited, to complement the cavities formed between the lithographic structures previously obtained. If necessary, an intermediate layer (e.g., of functional material) is deposited. Finally, a layer structure is fabricated on top of the last deposited layer to complete the upper reflector.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For many devices such as lasers, etc., additional structures like metal pads for making electrical contacts could be required, as for instance taught in, e.g. U.S. Pat. No. 5,245,622. Such additional structures are not discussed in the present document, as this description mainly revolves around the central optical part, i.e., the cavity (particularly the confinement layer). Still, one skilled in the art may appreciate that the present contribution is compatible with the usual, though application-specific, electrical or mechanical "framework" for vertical microcavities.

The invention claimed is:

1. A vertical microcavity comprising:
a first reflector and a second reflector, each comprising one or more material layers extending perpendicular to a vertical axis x; and
a confinement region extending between the first reflector and the second reflector, so as to be able to confine an electromagnetic wave,
wherein the confinement region comprises a single layer material,
wherein the single layered material is structured so as to create an effective refractive index variation for confining the electromagnetic wave,
wherein the confining is perpendicular to the vertical axis x in an average plane of the single layer material, and
wherein the structured single layer material comprises distinct lithographic structures.

2. The vertical microcavity of claim 1, wherein the distinct lithographic structures have, each, the same height H.

3. The vertical microcavity of claim 1, wherein the lithographic structures are configured so as for the confinement region to exhibit repeating sequences of at least two distinct refractive indices $n_1$, $n_2$, along a given direction in the average plane of the single layer material.

4. The vertical microcavity of claim 1, wherein in-plane dimensions of and/or in-plane separating distances between the lithographic structures are spatially modulated so as to create said effective refractive index variation in the average plane of the single layer material.

5. The vertical microcavity of claim 4,
wherein the lithographic structures comprise N distinct structures $S_1, S_2, \ldots, S_N$, each having a respective width $a_i$, wherein any two consecutive lithographic structures $S_i, S_{i+1}$ are separated by a distance $\Lambda_{i,i+1}$ along said given direction, and
wherein the ratio $r_i = a_i/\Lambda_{i,i+1}$ is a non-constant function of i, i=1, ..., N-1, whereby the ratio $r_i$ varies along said given direction in the average plane of the single layer material.

6. The vertical microcavity of claim 5, wherein one, or each of the width $a_i$ and the separating distance $\Lambda_{i,i+1}$ is a non-constant function of i, i=1, ..., N-1.

7. The vertical microcavity of claim 6, wherein each of the width $a_i$ and the separating distance $\Lambda_{i,i+1}$ is a non-constant function of i, i=1, ..., N-1.

8. The vertical microcavity of claim 6, wherein the ratio $r_i = a_i/\Lambda_{i,i+1}$ is a monotonically decreasing function of i, i=1, ..., N-1.

9. The vertical microcavity of claim 5,
wherein the micro cavity is configured so as to be able to confine an electromagnetic wave of wavelength $\lambda$, and
wherein the separating distance $\Lambda_{i,i+1}$ is less than $\lambda/2n_1$, where $n_1$ is the refractive index of the single layer material, and for all i=1, ..., N-1.

10. The vertical microcavity of claim 5, wherein each of said respective widths $a_i$ and a gap $g_{i,i+1}$ between two consecutive lithographic structures $S_i, S_{i+1}$ is less than $\lambda/4n_1$, for all i=1, ..., N-1, said gap $g_{i,i+1}$ such that $\Lambda_{i,i+1} = a_i + g_{i,i+1}$.

11. The vertical microcavity of claim 5, wherein the lithographic structures comprise N concentric, distinct structures, so as for the confinement region to exhibit repeating sequences of distinct refractive indices along a radial direction extending from a center of the concentric, distinct structures, in the average plane of the single layer material.

12. The vertical microcavity of claim 5, wherein the lithographic structures comprise N parallel, distinct structures, so as for the confinement region to exhibit repeating sequences of distinct refractive indices along one direction extending perpendicularly to the parallel structures in the average plane of the single layer material.

13. The vertical microcavity of claim 5, wherein the lithographic structures form a non-periodic, finite 2D lattice of lithographic structures, so as for the confinement region to exhibit repeating sequences of distinct refractive indices along each of two directions extending perpendicularly to each other and in the average plane of the single layer material.

14. The vertical microcavity of claim 3, wherein the confinement region exhibits repeating sequences of two distinct refractive indices $n_1$, $n_2$ along a given direction in the average plane of the single layer material.

15. The vertical microcavity of claim 14,
wherein a first of said distinct refractive indices $n_1$ is a refractive index of said single layer material, and
wherein a second of said distinct refractive indices $n_2$ is a refractive index of one of the following materials: air, a transparent material, an active material, a nonlinear material or a sensing medium for bio-sensor or environment sensor.

16. The vertical microcavity of claim 15, wherein the first of said distinct refractive indices $n_1$ is larger than the second of said distinct refractive indices $n_2$.

17. The vertical microcavity of claim 3,
wherein the lithographic structures comprise N concentric, distinct structures,
wherein the confinement region exhibits repeating sequences of two distinct refractive indices $n_1$, $n_2$ along a radial direction extending from a center of the N concentric, distinct structures, in the average plane of the single layer material, and
wherein the lithographic structures are configured so as for an effective refractive index of the lithographic structures to decrease from a value of a first one $n_1$ of the two distinct refractive indices to a value of a second one $n_2$ of the two distinct refractive indices.

18. The vertical microcavity of claim 1, wherein the average plane of the single layer material substantially corresponds to a midplane of an inner surface of the first reflector and an inner surface of the second reflector between which the confinement region is defined.

19. The vertical microcavity of claim 1, wherein each of said first reflector and said second reflector is one of:
a Bragg reflector;
a distributed Bragg reflector;
a metal reflector; and
a grating reflector.

20. A microcavity system, comprising the vertical microcavity of claim 11,
wherein the confinement region comprises several sets of lithographic structures, wherein each of the sets comprises concentric, distinct structures and defines repeating sequences of distinct refractive indices along a radial direction extending from a center of said each of the sets of lithographic structures, in the average plane of the single layer material, whereby said several sets of lithographic structures form, together with the first reflector and the second reflector, an array of several vertical microcavities.

21. The microcavity system of claim 20, wherein the centers of said each of the sets of lithographic structures are arranged according to a periodic 2D lattice in the average plane of the single layer material.

22. The microcavity system of claim 20,
wherein the confinement region comprises at least two sets of lithographic structures, wherein each of the sets comprises concentric, distinct structures and defines repeating sequences of distinct refractive indices along a radial direction extending from a center of said each of the set of lithographic structures, in the average plane of the single layer material, and
wherein said at least two sets of lithographic structures have distinct geometrical features so as to exhibit distinct resonance frequencies.

* * * * *